United States Patent [19]

Schlegel

[11] 4,176,371

[45] Nov. 27, 1979

[54] THYRISTOR FIRED BY OVERVOLTAGE

[75] Inventor: Earl S. Schlegel, Plum Borough, Pa.

[73] Assignee: Westinghouse Electric Corp., Pittsburgh, Pa.

[21] Appl. No.: 848,007

[22] Filed: Nov. 3, 1977

Related U.S. Application Data

[63] Continuation of Ser. No. 647,824, Jan. 9, 1976, abandoned.

[51] Int. Cl.$^2$ .............................................. H01L 29/74
[52] U.S. Cl. ........................................ 357/38; 357/13; 357/86; 357/89; 357/90
[58] Field of Search ....................... 357/13, 38, 39, 64, 357/86, 89, 90

[56] References Cited

U.S. PATENT DOCUMENTS

| | | | |
|---|---|---|---|
| 3,236,698 | 2/1966 | Shockley | 357/38 |
| 3,408,545 | 10/1968 | De Cecco et al. | 357/38 |
| 3,766,450 | 10/1973 | Voss et al. | 357/38 |

Primary Examiner—Joseph E. Clawson, Jr.
Attorney, Agent, or Firm—C. L. Menzemer

[57] ABSTRACT

A thyristor having an auxiliary cathode emitter region disposed in the central portion of the device in PN junction relationship with a cathode base region is disclosed. An extra impurity region of the same conductivity type as the cathode base region is disposed in the cathode base region in the central portion of the device inwardly of the outer boundary of the auxiliary cathode emitter. The extra impurity region has a higher impurity density gradient adjacent the common PN junction formed by the cathode and anode base regions than the remainder of such junction.

7 Claims, 5 Drawing Figures

THYRISTOR FIRED BY OVERVOLTAGE

This is a continuation of application Ser. No. 647,824 filed Jan. 9, 1976, now abandoned.

BACKGROUND OF THE INVENTION

1. Field of the Invention

The present invention relates to the firing of thyristors by a forward overvoltage.

2. Description of the Prior Art

A thyristor is a solid state four layer PNPN semiconductor device which supports a high voltage without significant conduction of current when in its high impedance blocking or "off" state; and conducts current when in its low impedance conducting or "on" state. Thyristors are capable of being turned on or fired by causing a threshold emitter current to flow. This cathode emitter current is primarily made up of electrons that are injected into the cathode or P-base region. These injected electrons induce anode-to-cathode current to flow and the thyristor fires by regenerative action. Thyristors may be either of the two terminal or three terminal types. In the three terminal type of thyristor, the cathode emitter current that causes the thyristor to fire is generated by applying a forward voltage between its cathode electrode connected to its cathode emitter layer or region and its gate electrode connected to its cathode base region. In two terminal thyristors, this cathode emitter current flows through the anode emitter. Thus, the difference between the two terminal and three terminal types of thyristor is primarily a matter of the manner in which the cathode emitter current which causes the thyristor to fire, is generated. In the case of the two terminal type, this cathode emitter current is generated by either of two means. The current can be created by increasing the anode-to-cathode voltage to the point at which the blocking PN junction (i.e., the junction between the cathode base and the anode base) loses its blocking ability (overvoltage) and starts to permit current flow. This usually occurs at the avalanche voltage of the blocking PN junction. Or, the emitter cathode current that fires the device can be generated by means of a rapidly increasing anode to cathode voltage that causes a displacement current to flow as the depletion layer capacitance of the junction between the cathode base and anode base changes its charge.

Commercially available two terminal thyristors are somewhat deficient in that they turn on at some randomly located non-predetermined point, the location of which depends on uncontrolled nonuniformities in the device. Such nonuniformities can make the performance of the device nonreproducible and cause it to be subject to unnecessary switching losses; and also subject to failure. The unnecessary switching losses are related to the fact that the area of the initial turn-on of the device is uncontrolled and larger than necessary. Thus, the build-up of current and charge density is slower than necessary. It is understood that switching losses are decreased by increasing the speed of turn-on of any thyristor.

In three terminal thyristors, it is known that the switching speed and losses are improved by building a small pilot thyristor within the area of the thyristor device. A given gate drive current, in this case, fires the small area pilot thyristor rapidly; and this, in turn, provides from the anode circuit, a large drive current that, in turn, fires the main thyristor rapidly and efficiently. However, even three terminal devices may be fired, intentionally or unintentionally, by the application of an overvoltage between its anode and cathode electrodes in the same manner as the two terminal device.

Thus, it has been proposed that a pilot thyristor may be utilized in a two terminal device to provide for more rapid firing or turn-on. In addition, various structures have been proposed to insure that the pilot thyristor fires prior to the firing of the main thyristor in response to an overvoltage.

For example, in U.S. Pat. No. 3,766,450 there is shown a three terminal thyristor with an auxiliary thyristor portion centrally located in the device where the portion of the anode base underlying the central portion of the cathode base to which the gate electrode is connected is formed with a higher impurity concentration than that of the anode base portion lying outwardly of such area. In this manner, the U.S. Pat. No. 3,766,450 teaches that the application of a voltage applied across the main anode to cathode terminals of the thyristor which exceeds the forward breakdown voltage insures that the auxiliary emitter is triggered ahead of the main emitter of the device. Also, U.S. Pat. No. 3,774,085 shows a three terminal thyristor, without an auxiliary thyristor portion, the anode or N-base which has an area of higher impurity concentration below the cathode and gate electrodes than that concentration of the N-base situated outwardly of the selected area in order that the thyristor is gated or triggered within an area encompassed by the electrodes when a breakover voltage is applied to the anode electrode. Although such proposed devices provided advantages in the operation of a thyristor in response to an overvoltage, it is realized that they are difficult to manufacture, in that the region of higher impurity concentration had to be present in the starting slice. This is difficult to produce. In the prior art the higher impurity concentration region is the result of natural area nonuniformities that occur when the ingot is grown. These are difficult to control.

In U.S. Pat. No. 3,906,545, there is shown a three terminal thyristor device that utilizes a higher impurity region within the cathode base of the device of the same conductivity type. In this prior art device, the higher doped P base region extends in the form of a plurality of narrow paths which emanate from the gate electrode and spread over the entire cross-sectional area of the gate zone. The apparent objective of that invention is to decrease lateral resistance in the cathode base, and would not effect the breakdown voltage of the junction between the cathode and anode bases.

Thus, it is desirable to provide a thyristor that may be either of the two terminal or three terminal type; and may be fired either intentionally or unintentionally, by overvoltage, with low switching losses, and in a predictable manner, and without danger of degrading or failure of the device. At the same time, it is desirable that such device be practical to manufacture and simple in its design.

In accordance with the present invention, and in contrast to the known prior art, a two terminal thyristor device has a centrally located auxiliary emitter portion with an extra P type diffusion in the cathode base region, located within the outer boundaries of such auxiliary emitter portion which locally decreases the avalanche voltage somewhat; and serves the purpose of insuring that in response to a high forward voltage, the avalanche will occur in the area of the extra diffusion.

Further, in keeping with the invention, either a two or a three terminal device may include an additional P type diffusion layer in the cathode base in the central portion of the device and slightly overlap the inner boundaries of the auxiliary emitter. This extra diffusion layer has a higher dopant density gradient, adjacent its junction with the anode base, than the regular P type diffusion layer that is outside of the extra diffusion region. This also insures that the avalanche will occur along the inner edge of the auxiliary emitter in an area where its electric field is highest in depletion layer at the junction between its cathode and anode bases. This provides for a further advantage in that additional carriers can be generated by carrier multiplication.

In contrast to the prior art, by making the diffused forward blocking PN junction more abrupt, rather than changing the dopant density in the anode base, the reduction in breakdown voltage is more easily kept small and reproducible. In principle, one should decrease the breakdown voltage only enough to bring it below the lowest breakdown voltage that would occur without the benefit of the present invention. A decrease in breakdown voltage beyond that necessary to insure that the designated region has the lowest breakdown voltage, needlessly degrades the performance of the thyristor. Because most of the breakdown voltage is supported in the depletion layer in the anode base region, changes in the cathode base produce only small, albeit adequate, decreases in the breakdown voltage. Hence, large process variations produce small changes in the breakdown voltage, and this increases the manufacturability of the device.

SUMMARY OF THE INVENTION

Broadly, the present invention relates to a thyristor that may be fired in response to a predetermined forward voltage such that its performance is reproducible and operates with low switching loss and without being subjected to failure because of uncontrolled turn-on. The device includes a body of semiconductor material that has first and second outer surfaces with four impurity regions of alternate conductivity type disposed in PN junction relationship. The regions include a cathode emitter and a cathode base. Each cathode emitter region and the cathode base region has a surface forming a portion of the first outer surface of the body. The regions also include an anode base region and an anode emitter region. The anode emitter region has a surface forming at least a portion of the second outer surface of the body. The cathode emitter region includes an inner and outer portion. The surface of the inner portion forms the central portion of the first outer surface, and has an outer boundary of a predetermined dimension. The outer portion is radially spaced from the outer boundary of the inner portion to form another portion of the first outer surface with at least a portion of the cathode base regions forming the outer surface of the body between the inner and outer cathode emitter regions. An extra impurity region of the same conductivity type as the cathode base region is disposed in the cathode base region centrally of the outer boundary of the inner cathode emitter region portion. The extra impurity region has a higher impurity density gradient, adjacent the PN junction formed by the cathode and anode base regions, than the gradient of said PN junction radially spaced from the extra impurity region.

A metallic electrode is in contact with the first outer surface and is disposed overlying the PN junction formed at the outer boundary of the inner cathode emitter portion and the cathode base region. Also, a metallic cathode electrode is in ohmic contact with the first outer surface formed by the outer cathode emitter region; and a metallic anode electrode is in ohmic contact with the second outer surface formed by the anode emitter region.

Thus, a predetermined overvoltage applied to the anode electrode causes the device to avalanche initially in the area of the extra P type region of the cathode base region.

Specifically, in one embodiment where the inner cathode emitter region is annular in configuration, the outer boundary of the extra P type diffusion in the cathode base region is so dimensioned that it intersects the inner cathode emitter region intermediate its inner and outer boundaries. Preferably, the inner boundary of the extra impurity region is close to, but out of alignment with, the inner boundary of the inner cathode emitter region.

DESCRIPTION OF THE PREFERRED EMBODIMENTS

Figure 1:
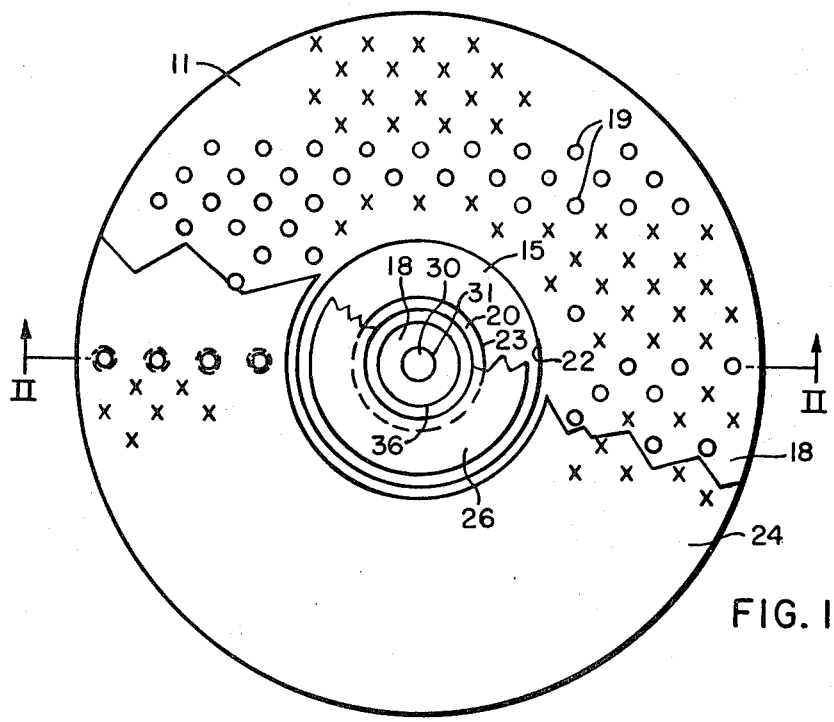
FIG. 1 is a plan view of a thyristor according to one embodiment of the invention with metallic electrodes cut away to show the diffusion pattern.
Figure 2:
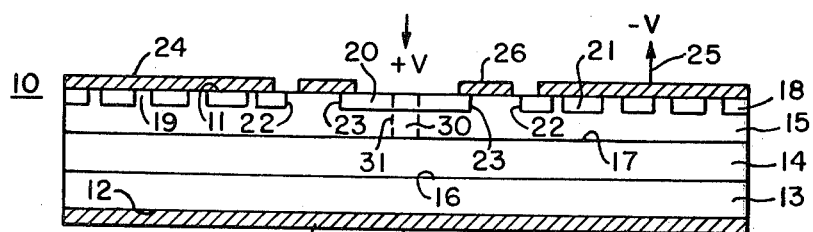
FIG. 2 is an elevation of FIG. 1 taken on line 22 of FIG. 1.

Referring to FIGS. 1 and 2, a semiconductor body 10 is provided for forming the thyristor adapted to fire in response to overvoltage in accordance with one embodiment of the present invention. The semiconductor body 10 is typically a commercially available, single crystal silicon wafer of circular shape having a thickness typically of about 10 to 20 mils, and having first and second opposed outer surfaces 11 and 12, respectively. Provided in the semiconductor body 10 are suitable impurities, to form impurity regions 13, 14, 15, and 18 of alternate type conductivity. The impurity region 13 is an anode emitter region, a surface of which forms the outer surface 12. The impurity region 14 is disposed in the body 10 adjacent the anode emitter region 13 at junction 16 to form an anode base region. The impurity region 15 adjoins the anode base region 14 at junction 17 to form a cathode base region. The cathode emitter region 18 includes an inner or auxiliary cathode emitter portion 20, and an outer or main cathode emitter portion 21. The main cathode emitter portion 21 has an inner boundary 22 and forms a portion of the first outer surface 11 radially spaced from the auxiliary cathode emitter portion 20 with a portion of the cathode base region forming the first outer surface of the body between the inner edge 22 of the main cathode emitter and an outer edge 23 of the auxiliary cathode emitter. The outer main P base 15 has portions 19 that extend to the first outer surface 11 to provide an emitter shunt configuration. In the embodiment of FIGS. 1 and 2, the auxiliary cathode emitter region 20 is disc shaped and forms the central portion of the outer surface 11 of the body 10. A ring shaped or annularly configurated cathode electrode 24 overlies and is in ohmic contact with the outer or main cathode emitter region 21 and the portions 19 of the cathode base 15; and to which a suitable cathode terminal represented at 25 is connected. An inner ring shaped metallic electrode 26 overlies and is in ohmic contact with a PN junction formed by the outer boundary 23 of the auxiliary cathode emitter 20 and the contiguous portion of the cathode base 15. The metallic electrode 26 is so dimensioned that its outer boundary is spaced radially inward from the inner boundary 22 of the main cathode emitter region 21. The metallic electrode 26 provides a path for current from an anode electrode 27 through the auxiliary cathode emitter 20 to the main cathode electrode 25. The anode electrode 27 is in ohmic contact with the anode emitter region 13 and has a suitable anode terminal referred to at 28.

Symmetrically located adjacent the center of the body 10 and the auxiliary cathode emitter 20 is an extra P type diffusion region 30 that is cylindrical in configuration and extends from the upper surface 11 of the body 10 to the PN junction 17 between the cathode base region 15 and the anode base region 14. This extra diffusion portion 30 is formed to have a higher impurity density gradient within an outer boundary 31 at the central or forward blocking PN junction 17, than exists at the central or forward blocking junction 17 outside of the extra diffusion 30. It is well known that a higher impurity density gradient decreases the avalanche breakdown voltage. This decreased avalanche breakdown voltage provides the means for insuring that the thyristor will avalanche first in this central predetermined location defined by the extra diffusion region 30. The central diffusion layer 30, which of course is of the same impurity type as the cathode base region, is created by an additional masked diffusion with a species such as boron that has a high solid solubility so that it can have a higher surface concentration than the P type diffusion surrounding the extra diffusion region 30 over the remaining portion of the device. Typically, the surface density of the central diffusion layer 30 might be $10^{20}$ boron atoms/cc, while that of the P type diffusion layer 15 outside of the region 30 would be typically 1 to $10 \times 10^{17}$ atoms/cc. The depth of the central diffusion layer is roughly the same (within 5 microns) as that of the main P type diffusion layer. If the central layer 30 is too shallow, it is not effective for decreasing the breakdown voltage. If it is too deep, it decreases the breakdown voltage unnecessarily beyond that needed to insure that the initial area to break down is in this central region occupied by the extra P type diffusion layer 30. The diameter of this central diffusion layer 30 is roughly 10 to 20 mils.

Figure 3:
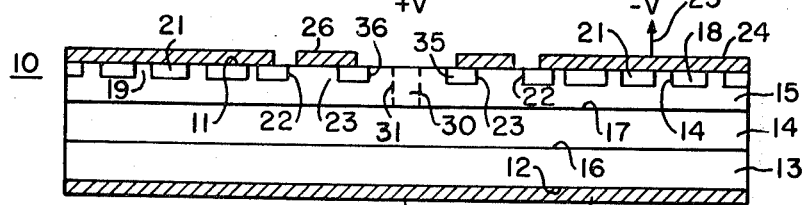
FIG. 3 is an elevation of another embodiment of the invention having a ring shaped auxiliary emitter.

Referring to the embodiment of FIG. 3, the body 10 is similar to the body 10 of FIG. 2 and bears similar reference numerals for identical parts thereof. However, in the embodiment of FIG. 3, an auxiliary emitter portion 35 is annular in configuration instead of being circular or disc shaped such as the auxiliary cathode emitter 20 of FIG. 2. The auxiliary cathode emitter 35 surrounds the extra P layer 30 in the cathode base region 15. The extra P diffusion 30 in the embodiment of FIG. 3 has its outer boundary spaced from an inner boundary 36 of the auxiliary emitter 35 and extends from adjacent the PN junction 17 to the first other surface 11 without intersecting the auxiliary cathode emitter 35.

Both the auxiliary cathode emitter 20 of FIG. 2 and the auxiliary cathode emitter 35 of FIG. 3 can be made smaller than the auxiliary cathode commonly used in three terminal devices since there is no need to contact this central region surrounded by the cathode emitter 35 with a gate electrode. By making the auxiliary emitter smaller, more area is left on the device for the main current carrying cathode emitter 24. In the event it is desired to construct a device which may include a gate electrode in contact with the P base region 15 centrally of the auxiliary cathode emitter 35, the outer diameter of the cathode emitter 35 may be 140 mils, and the inner diameter of the cathode emitter 35 may be 100 mils, for example. This gives room for a central contact that can easily be fabricated within the package with an economical alignment method. In the event that the device is designed so that no contact is needed, the aforesaid inner and outer diameters of the auxiliary cathode emitter 35 may be made much smaller. In fact, the diameter of the inner boundary of the auxiliary cathode emitter may be only a few mils larger than the diameter of the central diffused region 30. The outer diameter of the auxiliary cathode emitter 35 should then be about 30 to 60% larger than the inner diameter. This provides for a resistance in the cathode base under the small auxiliary cathode emitter 35 that allows for efficient operation of the auxiliary cathode. With reference to FIG. 2, where the auxiliary cathode emitter is disc shaped, the diameter could be in the neighborhood of 40 to 100 mils. For this embodiment, the outer diameter of the auxiliary cathode emitter 20 could be larger to yield a somewhat higher resistance to compensate for the fact that at a given current density, the current gain might be decreased by the higher dopant density of the cathode base 15. If desired, this decreased current gain may be avoided by diffusing the auxiliary cathode emitter region 20 deeper than that of the main cathode emitter region 21.

Figure 4:
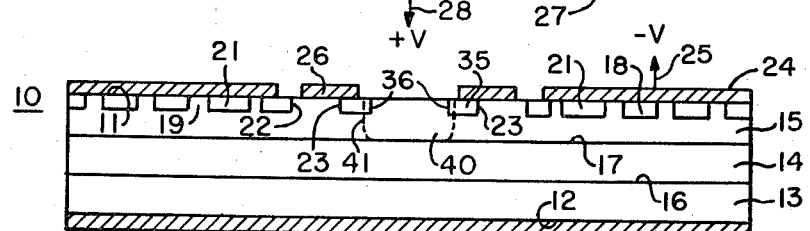
FIG. 4 is still another embodiment of the invention illustrating an alternate pattern for the extra P-type diffusion.

With reference to the embodiment illustrated in FIG. 4, the body 10 is similar to that described in connection with FIGS. 1, 2 and 3 and bears similar reference numerals for like parts of the device. However, in this embodiment, an extra impurity region 40 which has a higher impurity density gradient adjacent to PN junction 17 formed by the cathode and anode base regions 15 and 14, respectively, is circular or disc shaped and has an outer peripheral boundary 41 that intersects the auxiliary cathode emitter 35 close to its inner boundary or junction 36. Thus, the inner boundary 36 of region 35 is located entirely within the extra impurity region 40. This has the advantage in that the injection of electrons from the auxiliary cathode emitter 35 occurs in the area of the device in which the electric fields in the central blocking junction 17 are the highest. To assure this, the area of overlap between the diffused cathode emitter region 35 and the extra impurity region 40 in the cathode base 15 should be kept small. However, the additional P type impurity region 40 should not have its periphery aligned exactly with the inner boundary 36 of the auxiliary cathode emitter 35 because in this case not all of the emitted electrons will flow in the region in which this electric field is highest.

Figure 5:
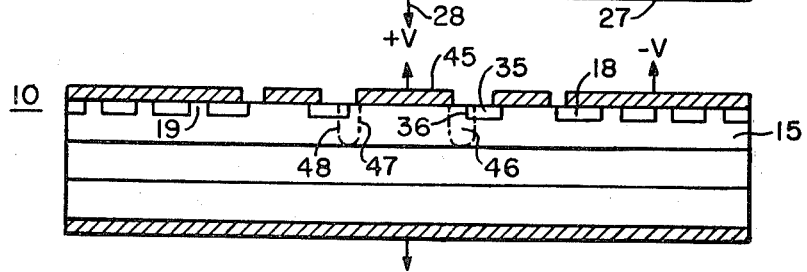
FIG. 5 is yet another embodiment of the invention illustrating the extra diffusion pattern in a ring shaped configuration with a gate electrode for use as a three terminal device.

Referring to FIG. 5, the body 10 is similar to the device described in connection with the previously described figures with like parts bearing similar reference numerals. However, this embodiment is included to illustrate the disposition of a gate electrode 45 such that the device can be used as a three terminal device if desired with the region of higher impurity in the cathode or P base 15 providing protection against overvoltage. Although the gate electrode 45 could be used with the extra impurity region 40 which is circular in configuration, this embodiment illustrates an annularly configured higher impurity region 46 which has an inner boundary 47 and an outer boundary 48. In this embodiment, the outer boundary 48 should be kept as closely as possible to the inner boundary 36 of the auxiliary cathode emitter 35 for the same reason discussed in the disposition of a gate electrode 45 such that the device can be used as a three terminal device if desired with the region of higher impurity in the cathode or P base 15 providing protection against overvoltage. Although the gate electrode 45 could be used with the extra impurity region 40 which is circular in configuration, this embodiment illustrates an annularly configured higher impurity region 46 which has an inner boundary 47 and an outer boundary 48. In this embodiment, the outer boundary 48 should be kept as closely as possible to the inner boundary 36 of the auxiliary cathode emitter 35 for the same reason discussed in connection with FIG. 4. It is also understood, that the annular region 46 may be utilized without the gate electrode 45.

Thus, it is seen that I have provided an improved thyristor which may be utilized in applications where the device is fired by a predetermined high anode to cathode voltage or in applications where it is desired to protect the device against inadvertent firing by a high anode to cathode voltage; which device has a low switching loss and is capable of being used in a series of two and three terminal silicon switches and thereby decreasing the amount of gate drive circuitry needed. Since the central region used to locally decrease the breakdown voltage is a diffusion layer that is added near the end of the fabrication processing sequence instead of being present in the starting material, there is a much sharper boundary to the higher doped region in the finished device. Also, it is much simpler to add one or more extra diffusions through the external surface than to construct the device with a higher dopant density localized within the starting slice. Further, because the region is formed by a masked diffusion, it is much easier to align such region properly with the auxiliary cathode emitter.

While the invention has been specifically described in connection with several preferred embodiments, it is distinctly understood that the invention may be otherwise variously embodied with alternate configurations of the metallic electrode 26 and the metallic electrode 24, such as providing radially extending fingers in the electrode 26 with corresponding recesses in the electrode 24 to provide for interdigitation, for example; or the electrode 26 in the embodiment of FIGS. 1 through 4 may be disc shaped. Also, various other cathode shunt or shorted emitter configurations may be utilized, and the relative dimensions and configurations with respect to the extra diffusion of higher P type impurities relative to the diameter of the auxiliary cathode emitter may be varied in accordance with the teachings of the present invention and scope of the appended claims.

What I claim is:

1. A thyristor adapted to fire in response to a predetermined forward overvoltage, comprising:
   a body of semiconductor material having first and second outer surfaces with four impurity regions of alternative type conductivity disposed in PN junction relationship;
   said regions being a cathode emitter region and a cathode base region, each having surfaces forming a portion of the first outer surface of the body, an anode base region and an anode emitter region, said anode emitter region having a surface forming at least a portion of the second outer surface of the body;
   said cathode emitter region including an inner auxiliary portion and an outer main portion, said auxiliary portion being disposed to form the central portion of the first outer surface and having an outer boundary of predetermined dimension, and said main portion being radially spaced from the inner portion with at least a portion of the cathode base region forming the first outer surface of the body between the auxiliary and main cathode emitter regions;
   an extra diffused impurity region of the same conductivity type as the cathode base region disposed in the cathode base region centrally of the outer boundary of the auxiliary cathode emitter region portion extending from the first outer surface to within five (5) microns of the PN junction formed by the cathode and anode base regions;
   said extra impurity region having a higher impurity density gradient adjacent the PN junction formed by the cathode and anode base regions than the density gradient of the PN junction radially adjacent to said extra region under said auxiliary portion of the cathode emitter region, and under the outer main portion of the thyristor;
   a metallic electrode in ohmic contact with the first outer surface disposed overlying the PN junction formed at the outer boundary of the auxiliary cathode emitter region and the cathode base region;
   a metallic cathode electrode in ohmic contact with the first outer surface formed by the main cathode emitter region portion; and
   a metallic anode electrode in ohmic contact with the second outer surface formed by the anode emitter region, whereby a predetermined overvoltage applied to the anode electrode causes the device to avalanche initially in the area of the said extra region of the cathode base region.

2. A thyristor according to claim 1 wherein the auxiliary portion of the cathode emitter region is annularly configured to surround the extra region with the centermost boundary of the inner cathode emitter region being radially spaced from the outer boundary of said extra region.

3. A thyristor according to claim 1 wherein the auxiliary portion of the cathode emitter region forms the central portion of the first outer surface, and the extra region is disposed to intersect the auxiliary cathode emitter region centrally in said inner cathode emitter region.

4. A thyristor according to claim 1 wherein the auxiliary portion of the cathode emitter region is of annular configuration, and the extra region is dimensioned such that it intersects the inner cathode emitter region intermediate its inner and outer boundaries.

5. A thyristor according to claim 4 wherein the intersection of the auxiliary cathode emitter region and the extra region is close to and larger than the inner boundary of the auxiliary cathode emitter region.

6. A thyristor according to claim 1 further including a gate electrode in ohmic contact with the first outer surface and so dimensioned that its outer boundary is radially spaced inwardly from the inner boundary of the auxiliary cathode emitter region portion.

7. A thyristor according to claim 4 wherein the extra region is annularly configured and has an inner boundary radially spaced inwardly from the inner boundary of the auxiliary cathode emitter region.

* * * * *